US 10,430,530 B2

(12) United States Patent
Meehan (10) Patent No.: US 10,430,530 B2
(45) Date of Patent: Oct. 1, 2019

(54) DRILLING DATA VISUALIZATION METHOD

(71) Applicant: Schlumberger Technology Corporation, Sugar Land, TX (US)

(72) Inventor: Richard J. Meehan, Houston, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 1056 days.

(21) Appl. No.: 14/651,357

(22) PCT Filed: Dec. 6, 2013

(86) PCT No.: PCT/US2013/073617
§ 371 (c)(1),
(2) Date: Jun. 11, 2015

(87) PCT Pub. No.: WO2014/093168
PCT Pub. Date: Jun. 19, 2014

(65) Prior Publication Data
US 2015/0324500 A1    Nov. 12, 2015

Related U.S. Application Data

(60) Provisional application No. 61/737,140, filed on Dec. 14, 2012.

(51) Int. Cl.
*G06G 7/48* (2006.01)
*G06F 17/50* (2006.01)
(Continued)

(52) U.S. Cl.
CPC .......... *G06F 17/5009* (2013.01); *E21B 44/00* (2013.01); *E21B 47/00* (2013.01); *G06F 17/18* (2013.01); *G06T 11/206* (2013.01)

(58) Field of Classification Search
None
See application file for complete search history.

(56) References Cited

U.S. PATENT DOCUMENTS 5,237,539 A     8/1993   Selman
6,078,867 A *   6/2000   Plumb .............. G01V 1/50
                                              702/6
(Continued)

FOREIGN PATENT DOCUMENTS

EA     007962 B1     2/2007
GB     2460189 B     9/2011
(Continued)

OTHER PUBLICATIONS

Szerbiak, R. B., et al. "3-D characterization of a clastic reservoir analog: From 3-D GPR data to a 3-D fluid permeability model." Geophysics 66.4 (2001): 1026-1037.*
(Continued)

*Primary Examiner* — Rehana Perveen
*Assistant Examiner* — Nithya J. Moll
(74) *Attorney, Agent, or Firm* — Alec J. McGinn (57) ABSTRACT

A method for generating a visual representation of wellbore drilling parameters includes representing a predetermined length of drilled wellbore as a two dimensional shape, wherein one dimension of the shape corresponds to the predetermined length and the other dimension of the shape corresponds to at least one of a drilling parameter, a statistical measure of a drilling parameter and an environmental parameter. In a computer, values of the at least one of a drilling parameter, a statistical measure of a drilling or environmental parameter and an environmental parameter are received as input. The two dimensional shape is plotted in a visual representation.

20 Claims, 13 Drawing Sheets

(51) Int. Cl.
  *E21B 47/00* (2012.01)
  *G06F 17/18* (2006.01)
  *G06T 11/20* (2006.01)
  *E21B 44/00* (2006.01)

(56) References Cited

U.S. PATENT DOCUMENTS

| | | | |
|---|---|---|---|
| 6,152,246 A | 11/2000 | King et al. | |
| 7,003,439 B2 * | 2/2006 | Aldred | E21B 44/00 175/45 |
| 7,526,930 B2 * | 5/2009 | Guidry | G01V 1/34 175/50 |
| 7,596,481 B2 * | 9/2009 | Zamora | E21B 47/0002 702/18 |
| 8,731,872 B2 * | 5/2014 | Czernuszenko | G06F 17/50 703/1 |
| 2005/0209866 A1 * | 9/2005 | Veeningen | G06Q 10/06 705/7.28 |

FOREIGN PATENT DOCUMENTS

| | | |
|---|---|---|
| RU | 2337404 C1 | 10/2008 |
| SU | 806855 A1 | 2/1981 |
| WO | 2014093168 A1 | 6/2014 |

OTHER PUBLICATIONS

International Search Report for International Application No. PCT/US2013/073617 dated Feb. 14, 2014.
ProNova, TDE Thonhauser Data Engineering, 2014, TDE GmbH, [web page], retrieved on Jun. 11, 2015 from the Internet: <URL: http://www.tde.at/>.
Anonymous, "LogPlot: design borehole logs using Log Designer," RockWare retrieve at http://web.archive.org/web/20080824201847/http://www.rockware.com/product/overviewSection.php?id=176&section=43 on Oct. 3, 2018.
Search Report for the equivalent European patent application 13862845.8 dated Sep. 1, 2016.
Communication pursuant to Art 94(3) for the equivalent European patent application 13862845.8 dated Sep. 14, 2016.
Communication pursuant to Art 94(3) for the equivalent European patent application 13862845.8 dated May 11, 2017.
Communication pursuant to Art 94(3) for the equivalent European patent application 13862845.8 dated Oct. 4, 2018.

* cited by examiner

DRILLING DATA VISUALIZATION METHOD

BACKGROUND

This disclosure relates generally to the field of wellbore drilling through subsurface earthen formations. More specifically, the invention relates to techniques for visual presentation of drilling performance data to enable a user to determine drilling response to various formations and drilling operating parameters.

Drilling wellbores through subsurface formations includes evaluation of drilling data from nearby drilled wellbores ("offset analysis"). During offset analysis a large amount of time and depth based data must be reviewed to help the analyst understand the relationships between the subsurface environment, the drilling equipment, and the drilling operating parameter choices and practices used, and how these relationships affect overall drilling performance. Techniques known in the art for such analysis include those described, for example in U.S. Pat. No. 6,152,246 issued to King et al.

There exists a need for improved techniques for visual analysis of drilling performance data in order to assist in planning and drilling of subsurface wellbores.

SUMMARY

One aspect of the disclosure is a method for generating a visual representation of wellbore drilling parameters including representing a predetermined length of drilled wellbore as a two dimensional shape, wherein one dimension of the shape corresponds to the predetermined length and the other dimension of the shape corresponds to at least one of a drilling parameter, a statistical measure of a drilling parameter and an environmental parameter. In a computer, values of the at least one of a drilling parameter, a statistical measure of a drilling or environmental parameter and an environmental parameter are received as input. The two dimensional shape is plotted in a visual representation.

Other aspects and advantages of the invention will be apparent from the description and claims which follow.

DETAILED DESCRIPTION

Figure 1:
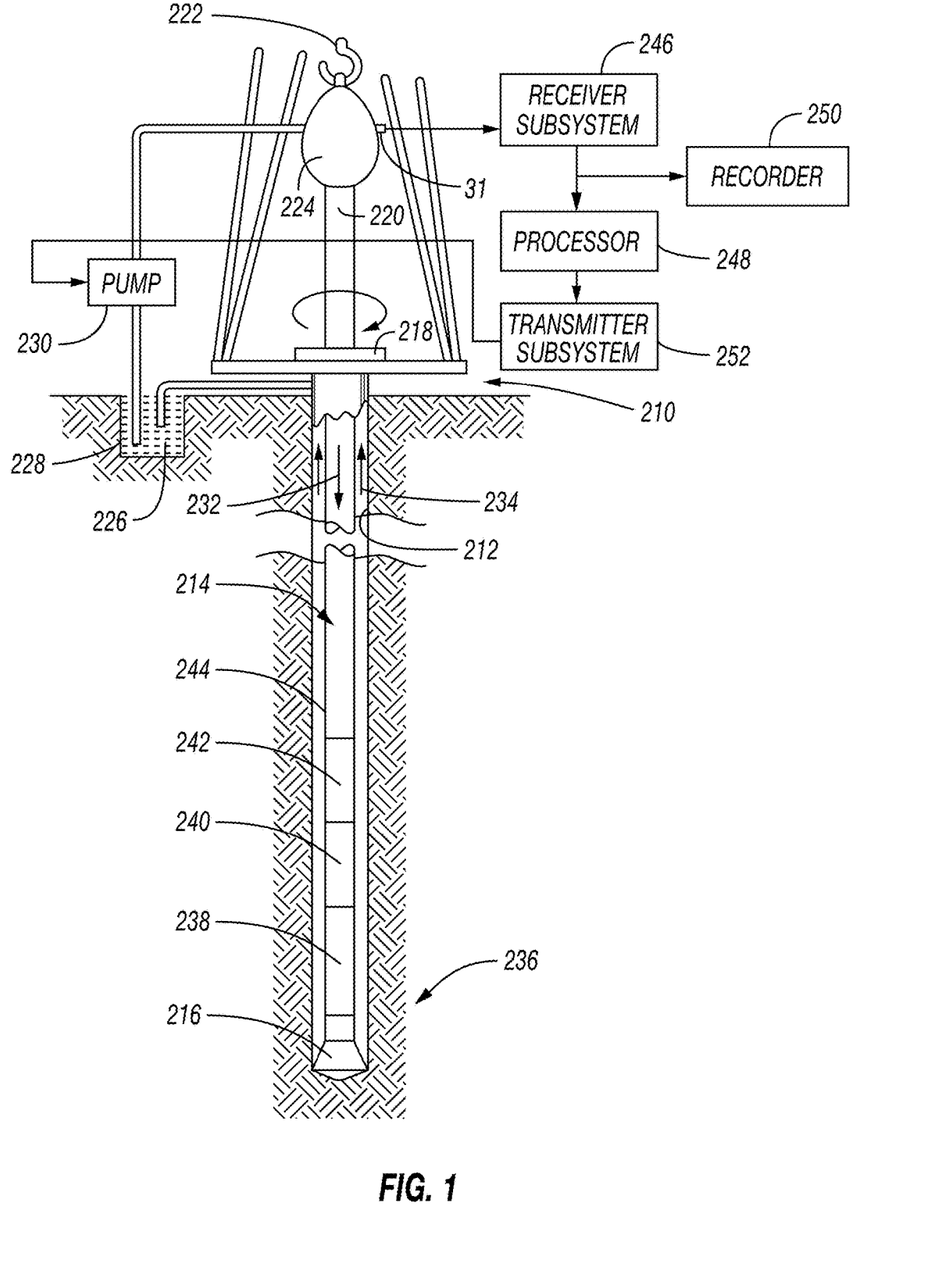
FIG. 1 shows an example drilling system.

FIG. 1 shows an example of drilling a wellbore through subsurface formations. Drilling may use a system including a platform and derrick 210 are positioned over a wellbore 212 that may be formed in the Earth by rotary drilling. A drill string 214 may be suspended within the borehole and may include a drill bit 216 attached thereto and rotated by a rotary table 218 (energized by means not shown) which engages a kelly 220 at the upper end of the drill string 214. The drill string 214 is typically suspended from a hook 222 attached to a traveling block (not shown). The kelly 220 may be connected to the hook 222 through a rotary swivel 224 which permits rotation of the drill string 214 relative to the hook 222. Alternatively, the drill string 214 and drill bit 216 may be rotated from the surface by a "top drive" type of drilling rig. The drill string 214 may be assembled from segments ("joints" or "stands") of pipe threadedly coupled together end to end.

Drilling fluid or mud 226 is contained in a mud pit 228 adjacent to the derrick 210. A pump 230 pumps the drilling fluid 226 into the drill string 214 via a port in the swivel 224 to flow downward (as indicated by the flow arrow 232) through the center of the drill string 214. The drilling fluid exits the drill string via ports in the drill bit 216 and then circulates upward in the annular space between the outside of the drill string 214 and the wall of the wellbore 212, as indicated by the flow arrows 234. The drilling fluid 226 thereby lubricates the bit and carries formation cuttings to the surface of the earth. At the surface, the drilling fluid is returned to the mud pit 228 for recirculation. If desired, a directional drilling assembly (not shown) could also be employed.

A bottom hole assembly ("BHA") 236 may be mounted within the drill string 214, preferably near the drill bit 216. The BHA 236 may include subassemblies for making measurements, processing and storing information and for communicating with the Earth's surface. The bottom hole assembly is typically located within several drill collar lengths of the drill bit 216. In the illustrated BHA 236, a stabilizer collar section 238 is shown disposed immediately above the drill bit 216, followed in the upward direction by a drill collar section 240, another stabilizer collar section 242 and another drill collar section 244. This arrangement of drill collar sections and stabilizer collar sections is illustrative only, and other arrangements of components in any implementation of the BHA 236 may be used. The need for or desirability of the stabilizer collars will depend on drilling conditions.

In the arrangement shown in FIG. 1, the components of a drilling tool assembly subassembly that may include various measuring instruments and may be located in the drill collar section 240 above the stabilizer collar 238. Such components could, if desired, be located closer to or farther from the drill bit 216, such as, for example, in either stabilizer collar section 238 or 242 or the drill collar section 244. The drill collar section 240 may include one or more sensors (not shown).

The BHA 236 may also include a telemetry subassembly (not shown) for data and control communication with the Earth's surface. Such telemetry subassembly may be of any suitable type, e.g., a mud pulse (pressure or acoustic) telemetry system, wired drill pipe, etc., which receives output signals from LWD measuring instruments in the BHA 236 (including the one or more radiation detectors) and transmits encoded signals representative of such outputs to the surface where the signals are detected, decoded in a receiver subsystem 246, and applied to a processor 248 and/or a recorder 250. The processor 248 may comprise, for example, a suitably programmed general or special purpose processor. A surface transmitter subsystem 252 may also be provided for establishing downward communication with the bottom hole assembly. The processor 248 may be used to generate certain types of visual representations as will be further explained.

The BHA 236 can also include conventional acquisition and processing electronics (not shown) comprising a microprocessor system (with associated memory, clock and timing circuitry, and interface circuitry) capable of timing the operation of the accelerator and the data measuring sensors, storing data from the measuring sensors, processing the data and storing the results, and coupling any desired portion of the data to the telemetry components for transmission to the surface. Alternatively, the data may be stored downhole and retrieved at the surface upon removal of the drill string. Power for the LWD instrumentation may be provided by battery or, as known in the art, by a turbine generator disposed in the BHA 236 and powered by the flow of drilling fluid.

In order to improve drilling operations it is necessary to understand the relationship between the equipment and processes used, and the resulting performance. This often requires the study of data acquired during previous drilling campaigns (offset well data). The drilling process is complex, and using offset data to relate cause and effect can be difficult. To help with that process data visualization techniques are proposed in this disclosure.

The drilling of a wellbore can be separated into phases of different resolution. As an example, a well can be thought of as consisting of hole sections. A wellbore section may be a portion of the wellbore that is a particular nominal diameter, for example a 26 inch section, followed by a 17½ inch section, followed by a 12¼ inch section, etc. Each wellbore section will usually be drilled with one or more BHA or bit runs, as explained with reference to FIG. 1. During each BHA or bit run, the wellbore is axially lengthened (i.e., made deeper) by means of lengthening the drill string. The drill string, as explained with reference to FIG. 1 is typically composed of a series of drill pipes, of approximately equal length, connected together end to end. During drilling (or tripping) these pipes are usually added to the drill string in groups of 3, normally known as a "stand." Sometimes groups of 2 or 4 are used to produce a stand. Sometimes a single drill pipe is added at a time. However normal practice is to use stands of 3 pipes. The usual length of a stand is approximately 29 meters (30 feet), but this may vary.

The drilling process consists of drilling ahead until the wellbore is the same length as the drill string. Then drilling stops, another stand is connected to the surface end of the drill string, and drilling recommences. This series of operations (drilling a stand, connection, drilling a stand, connection, etc.) means that the drilling process is essentially split up into process units. This leads to the opportunity to visualize both inputs and outputs of the drilling process in units of stands and connections.

Figure 2:
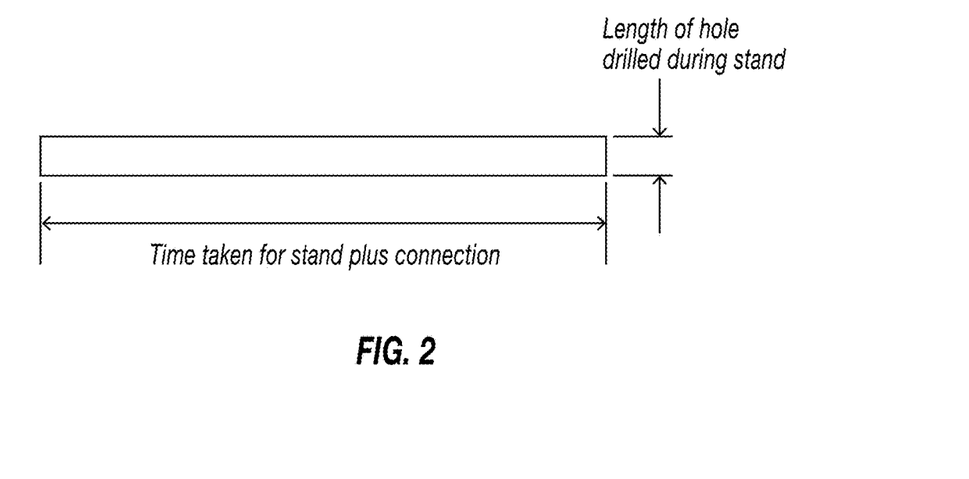
FIG. 2 shows a basic representation of visual representation of drilling of a single "joint" or "stand" of drill string in two dimensions, e.g., axial elongation and time.

Referring to FIG. 2, each stand may be represented by a two dimensional shape such as a rectangle. The length of each rectangle may correspond to the time taken to drill the stand, and the time taken to make the connection associated with it. The width of the rectangle may corresponds to the increase in the hole length while drilling the stand.

Figure 3:
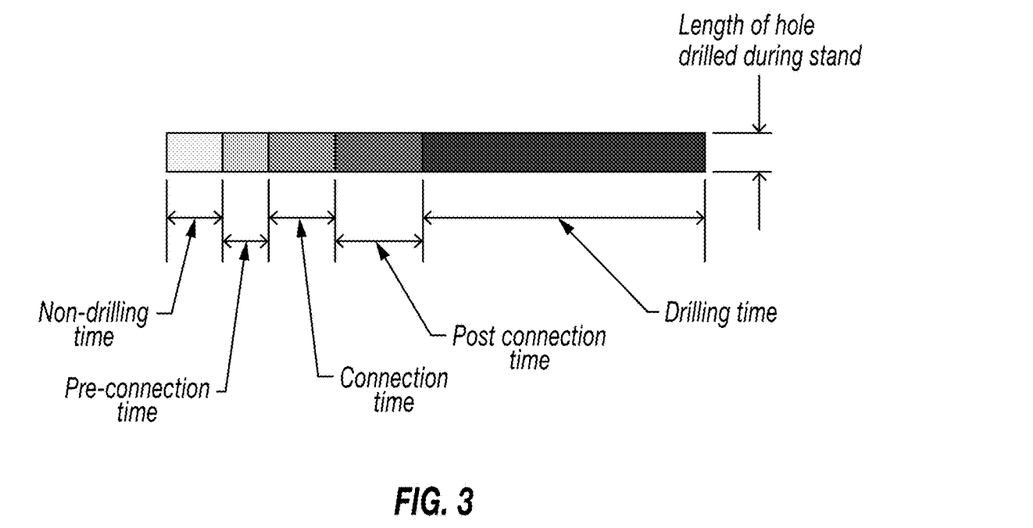
FIG. 3 shows a further detailed version of the basic representation shown in FIG. 2 showing various activities associated with each stand.

Referring to FIG. 3, the rectangle of FIG. 2 may be colored, coded or filled to show various aspects of the drilling process. For example the time taken for various operations during the drilling and connection can be represented as shown in FIG. 3.

Figure 4A:
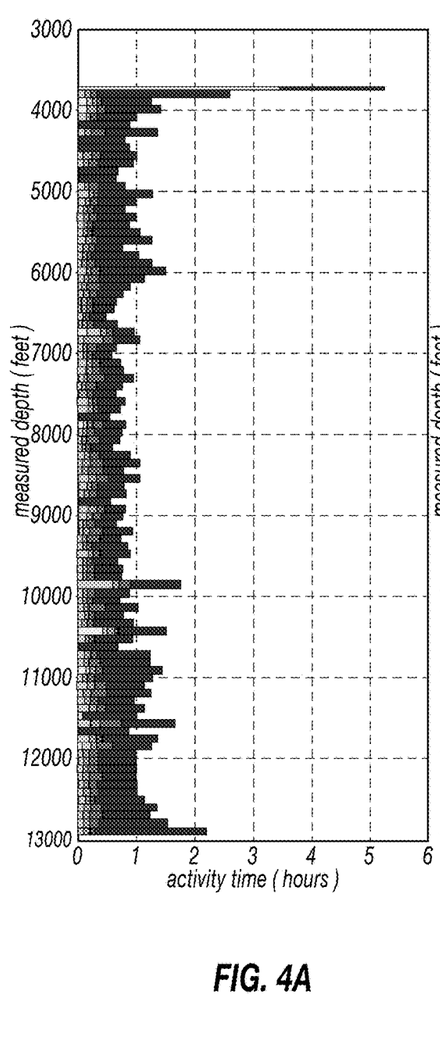
FIG. 4A shows two dimensional plots aligned at the beginning of activity time for each stand of drill string.
Figure 4B:
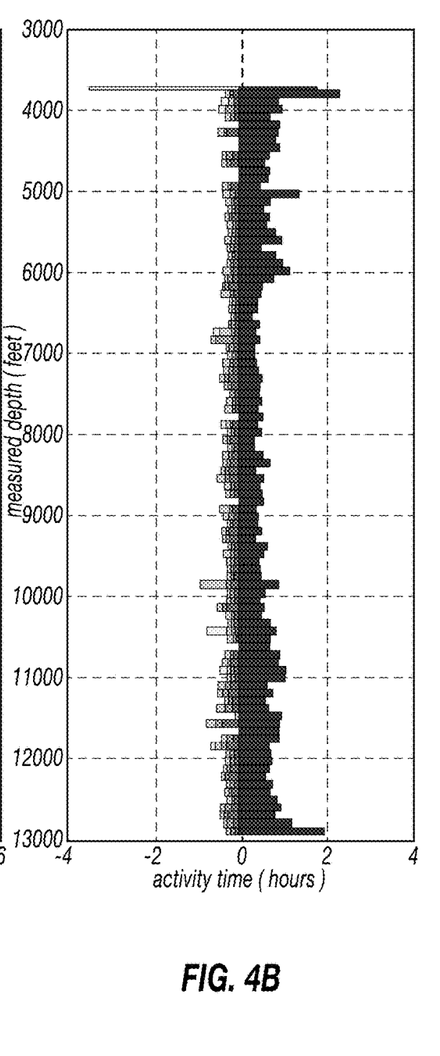
FIG. 4B shows the two dimensional plot of FIG. 4A time aligned to start of drilling for each stand.

The rectangles for each stand can be plotted next to each other, to show how the aspects of the drilling process vary as the wellbore drilling progresses. An example plot in FIGS. 4A and 4B shows the time breakdown for drilling one hole section of a well. In the FIG. 4A, zero time is set to the beginning of the non-drilling part of each stand. In the FIG. 4B the drilling time (in cyan) is shown to the right of the zero on the x-axis (time axis) while the connection and non-drilling related times are shown on the left of the zero. Such presentation allows the analyst to see at a glance how the on-bottom drilling times and the non-drilling times vary as the wellbore is progressively lengthened. The zero time axis can be chosen to align with any of the time categories, to allow the analyst to better understand the data.

Figure 5:
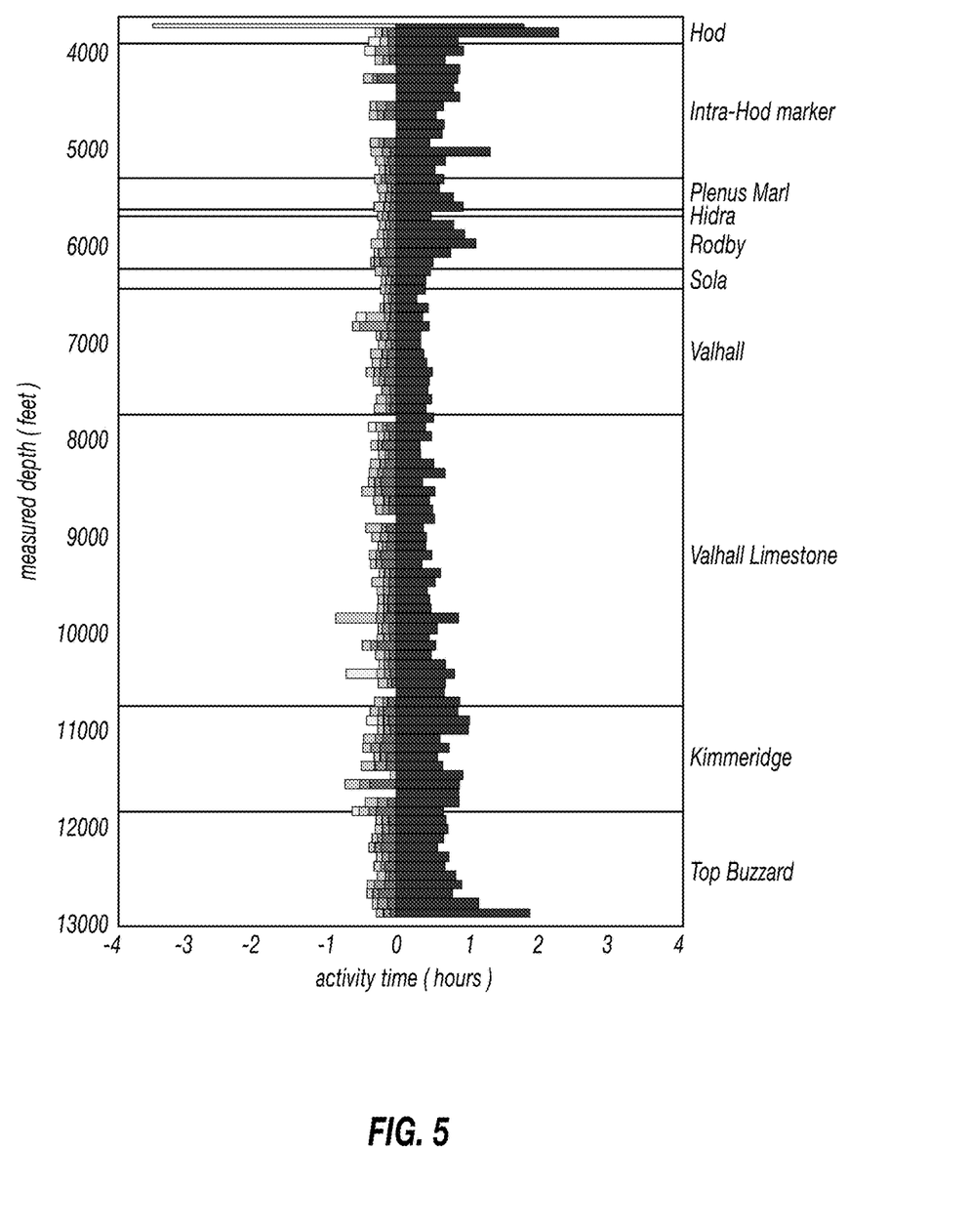
FIG. 5 shows a plot as in FIG. 4B including a lithology identifier.

To give more context to the foregoing visualization, an indicator of the changing rock mineral composition (lithology) with respect to axial length (depth) of the wellbore may also be plotted. In the example shown in FIG. 5, the same information as shown in FIG. 4B is displayed, against a background of the different lithologies encountered while drilling the wellbore. In this way the analyst can relate drilling performance to lithology.

Figure 6:
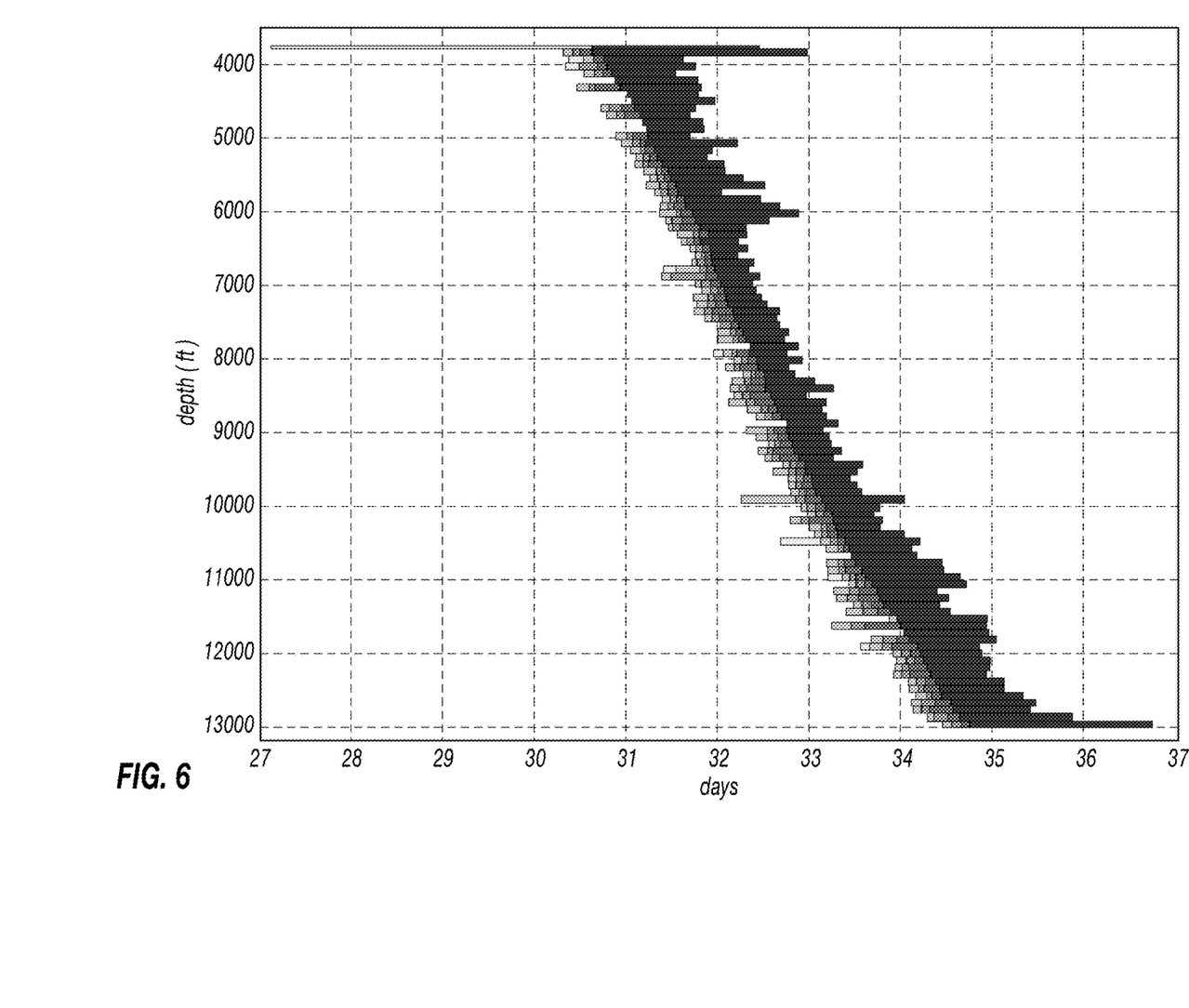
FIG. 6 shows a plot as in FIG. 4B aligned to a time depth curve for a drilled wellbore.

Another way to visualize the data in context is to plot each rectangle in an appropriate position on a time-depth curve for the well, as shown in FIG. 6. In this case the x-axis of FIG. 4B may be transformed to a curve corresponding to time in days and axial length of the wellbore to show the progression of the time-depth curve. The length of each rectangle explained with reference to FIG. 4B has been multiplied by a factor to preserve relative times but to make the variation per stand visible to the analyst. The lithology information could also be included on the example plot of FIG. 6. Observing the time breakdown data in this way may allow the analyst to identify quickly where drilling efficiency is high, and where it is low. Since the individual stands can be easily identified it is then easy to go back to the source of the data for a more detailed review of the existing drilling operating parameters (e.g., axial force on the drill bit, drilling fluid flow rate, rotation rate of the drill bit, etc.) and environmental parameters (e.g., lithology, drilling fluid hydrostatic pressure, formation fracture and pore pressure, rate of penetration, etc.).

Figure 7:
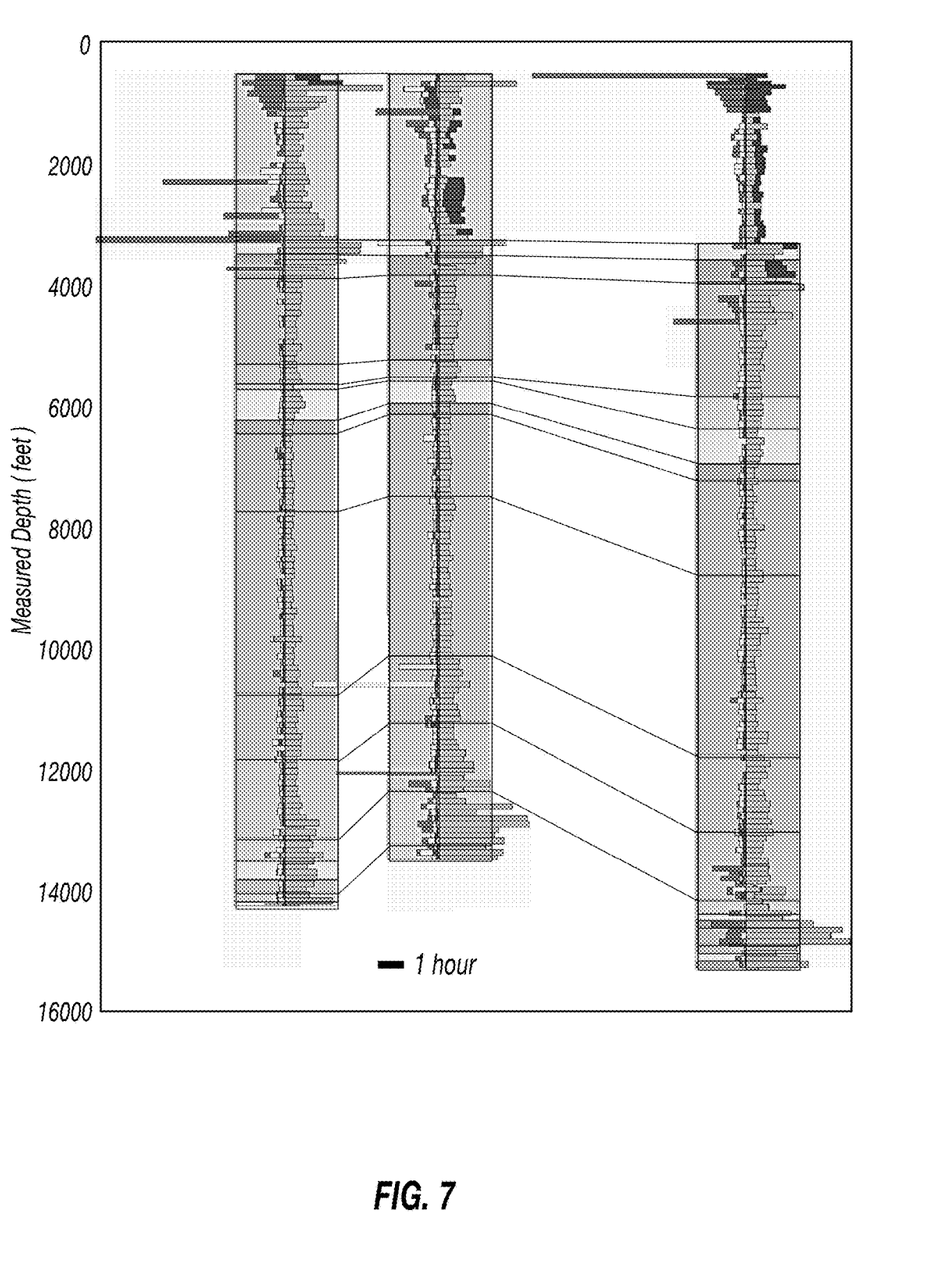
FIG. 7 plots as in FIG. 5 for a plurality of wellbores on the same plot.

Plotting such as shown in FIG. 6 may also be performed for multiple wells on the same plot. FIG. 7 shows an example of three wells plotted together. It is easy to associate the time breakdown with lithology and depth across the three wells as shown in FIG. 7.

Figure 8:
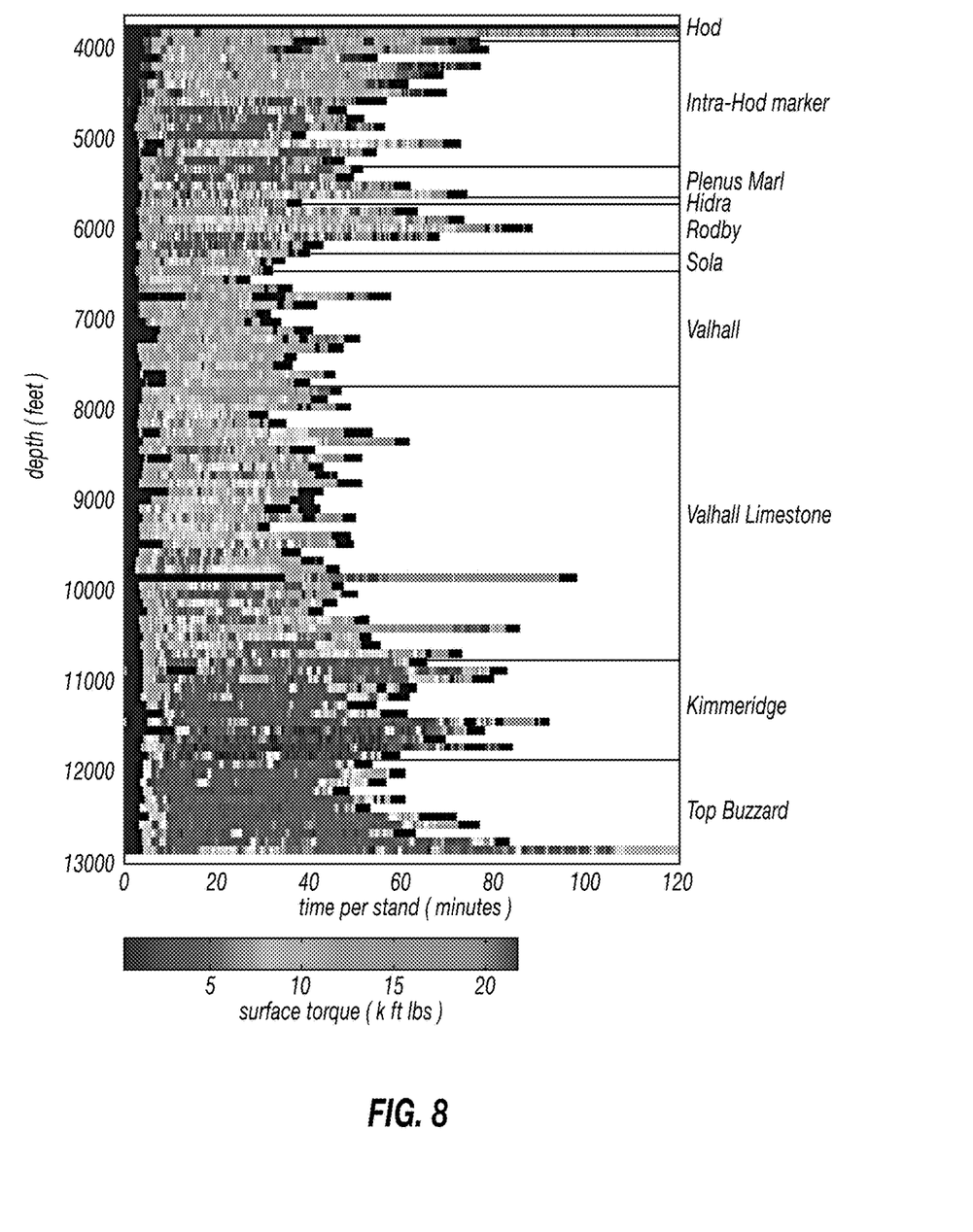
FIG. 8 shows a plot including coding for a drilling parameter.

The foregoing plotting technique can be used to display information other than the time breakdown per stand. For example the analyst is often interested in knowing how some other parameters vary with both time and depth. Instead of color coding the time information into each rectangle, drilling parameter information may be represented. For example, the diagram in FIG. 8 shows surface torque encoded in this way. As each stand is drilled the surface torque varies with time. This variation may be represented as color coding or other coding along each stand's rectangle. The plot in FIG. 8 may allow the analyst to recognize how the surface torque varies with both time and depth across the entire wellbore or wellbore section. Such a plot may be easy to understand, and may allow the analyst to readily identify areas of interest that may require further investigation. Since each unit of the drilling process is clearly defined, the analyst can relate the drilling parameter measurement to the lithology and drilling practices. As with the time breakdown data of FIGS. 4A through 7, the type of representation of FIG. 8 could be plotted along the time depth curve, or plotted across multiple wells.

Figure 9:
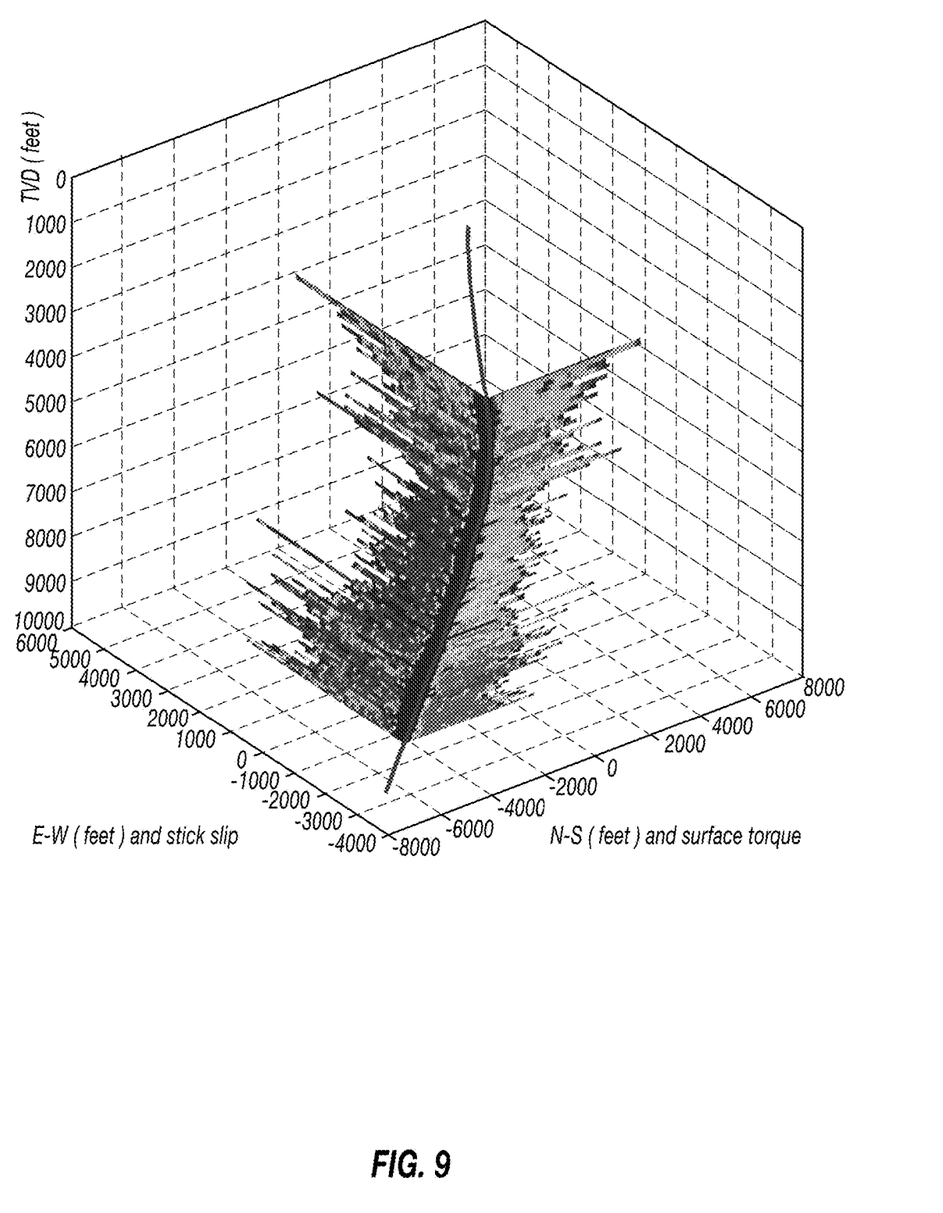
FIG. 9 shows a plot as in FIG. 4B aligned to a geodetic trajectory of a wellbore.

Another way to provide more context to a type of display such as those described with reference to FIGS. 2 through 8 is to plot the rectangles along the well geodetic trajectory in 3D space, as shown in FIG. 9, wherein two drilling parameters are plotted, surface torque as above, and stick-slip. Here the analyst can relate the drilling parameters to the depth, the sequence in the process, and the position along the trajectory in 3D space. If an earth model representation of the subsurface is available showing lithology, stress, or other relevant information, then that too can be plotted in the 3D space. Multiple wells with different geodetic trajectories may be plotted in the same diagram, allowing the analyst to see a wide variety of information in a single, compact visualization.

Another useful way of observing drilling data is to view it in the depth domain. In techniques known in the art for petrophysical and similar measurements, this is performed in "log" format, where curves corresponding to the parameters of interest are plotted against the measured depth of the well (or may be converted to true vertical depth, etc.). This is a useful technique, but because the parameter is plotted with respect to depth (or axial length of the wellbore) the analyst may have to make a choice between the depth range and the resolution. Being able to observe a large depth range is important, especially at the beginning of the analysis process, but as a result of the data being better presented if fit on a single curve, resolution may be lost.

The stand rectangle technique described with reference to FIGS. 2 through 9 can be modified to deal with this. When observing depth based data, parameters of interest are normally plotted only when the bit is on bottom (see, e.g., FIG. 1) and the depth is increasing. As explained with reference to FIG. 2, one can represent each stand as a rectangle, where the position along the length of the rectangle represents the height of the travelling block above the rig floor (see FIG. 1), as shown in FIG. 10.

Figure 10:
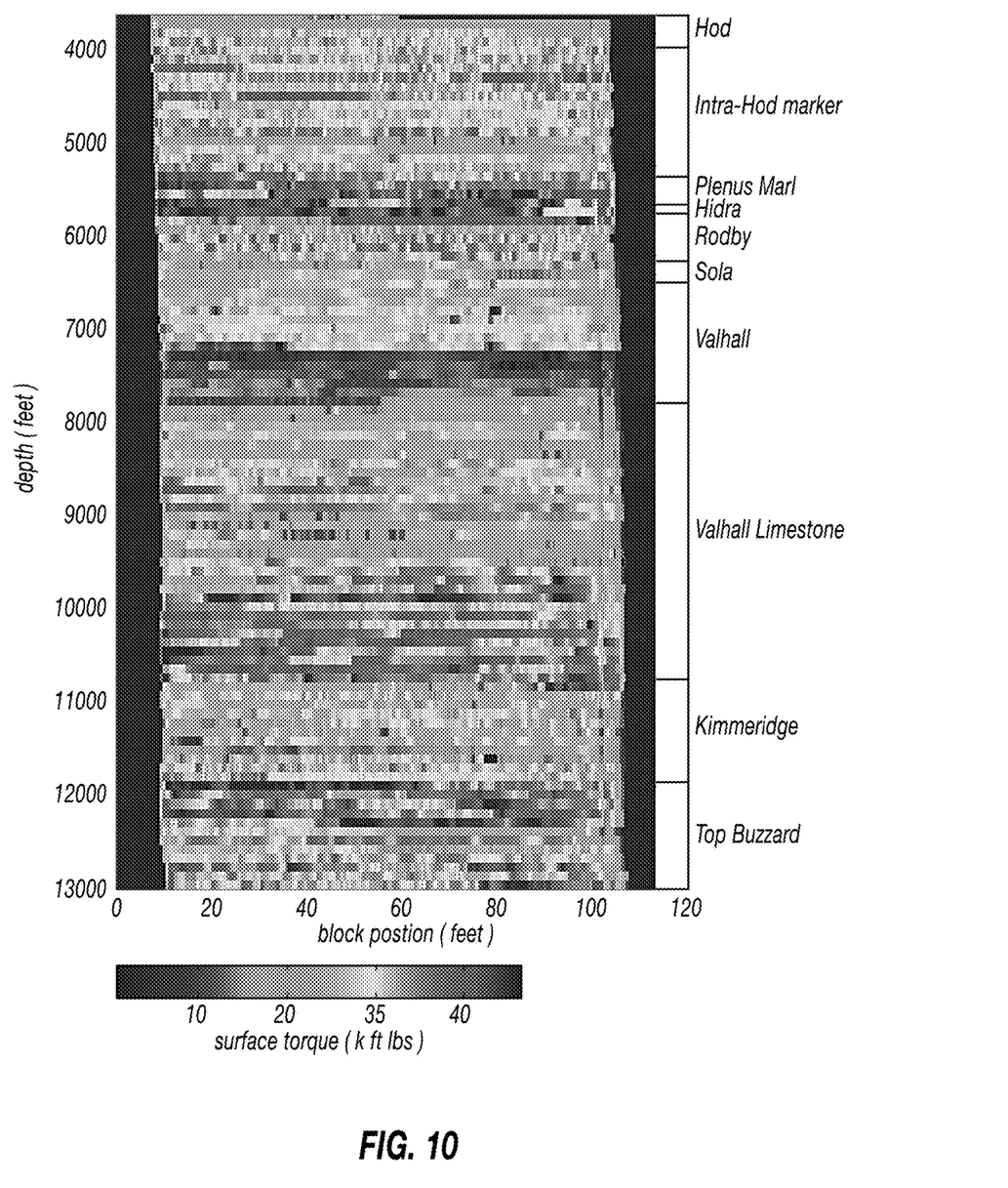
FIG. 10 shows a plot coded for one drilling parameter and having a second dimension corresponding to another drilling parameter.

As in other examples explained above, the parameter of interest can be color coded or otherwise onto each rectangle, and the rectangles for consecutive stands can be stacked, to produce a diagram as shown in FIG. 10. In FIG. 10 the axial force (weight) on the drill bit is shown as a function of block position for each stand. The analyst may identify weight on bit versus depth data for the entire wellbore section in a single glance, and can relate the value of the parameter (e.g., weight on bit) to the depth, stand, and sequence of operations. As with the time based stand representation described above, the technique explained with reference to FIG. 10 may be plotted against the time-depth curve, or in a 3D window along the wellbore trajectory as explained with reference to FIG. 9.

Figure 11:
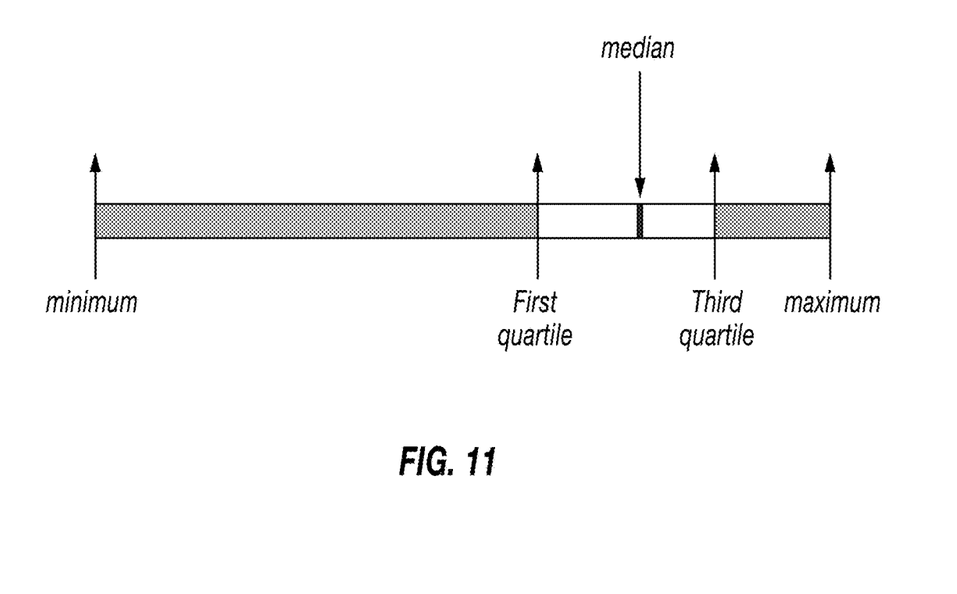
FIG. 11 shows a plot as in FIG. 3 but corresponding to statistical measures of a parameter instead of values of the parameter.

Sometimes the analysts may not interested in the detail of how parameters changed during a stand, but may be more interested in certain statistical measures of the parameter variation in each stand. The stand representation explained with reference to FIG. 3 may be adapted to use one or more standard statistical views, such as variance, standard deviation, skew, etc. As an example consider the common "box and whiskers" type display shown in FIG. 11. As in FIG. 3, the width of the rectangle may correspond to the depth drilled during the stand. The length of the rectangle may correspond to the difference between the minimum and maximum of the parameter of interest. The first and third quartiles are shown, along with the median. Note the same type of plot could easily show the mean and standard deviation instead. Stacking the rectangles associated with consecutive stands provides a diagram such as shown in FIG. 12.

Figure 12:
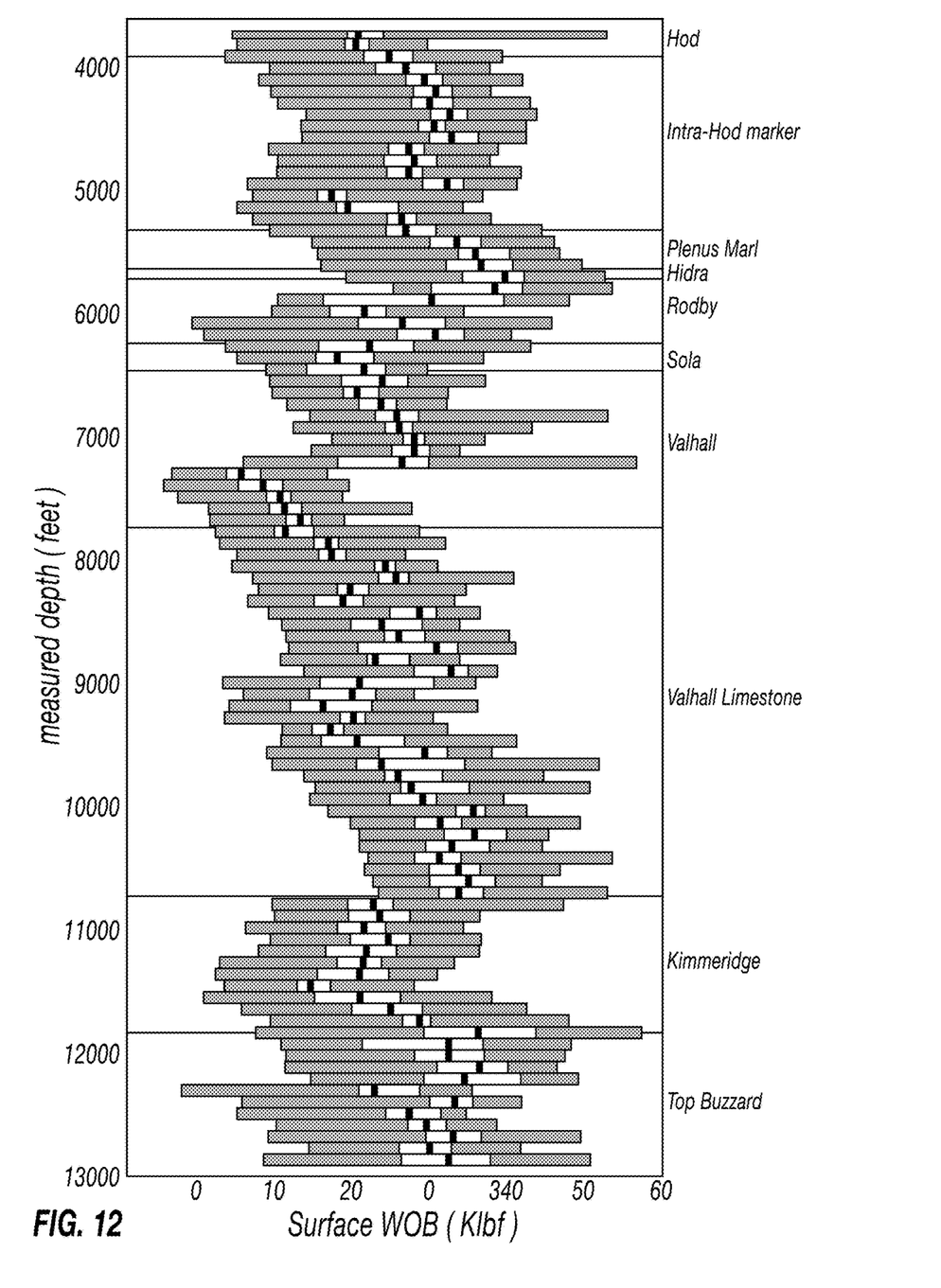
FIG. 12 shows a plot as in FIG. 4B but of statistical measures rather than parameter values.
Figure 13:
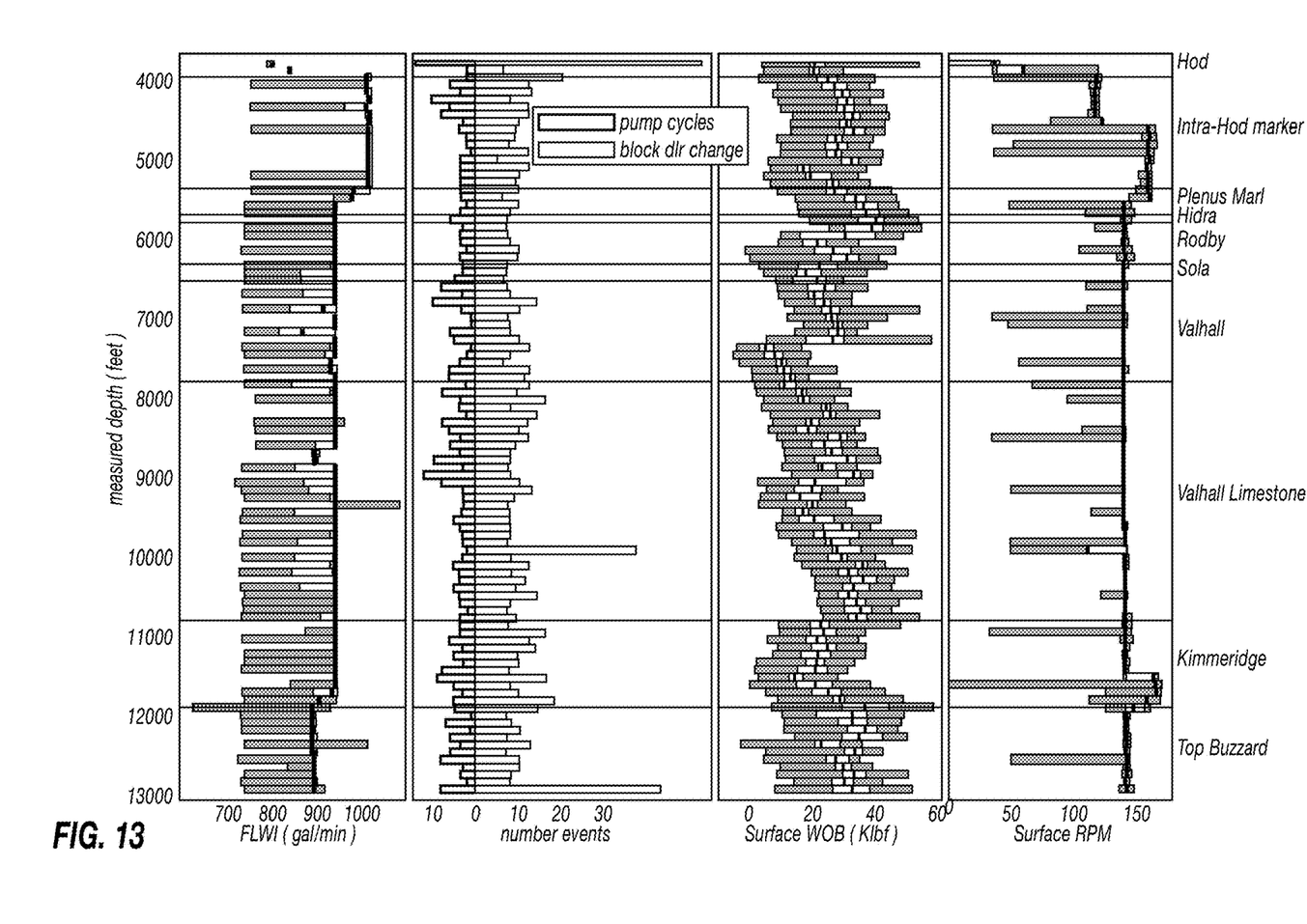
FIG. 13 shows a plurality of statistical measures plotted side by side in the same visual representation.

In FIG. 12, the variation of the statistics of the parameters can be readily observed as drilling progresses. As explained with reference to FIG. 6 it is possible to plot these variations along the time-depth curve, along the trajectory in a 3D view as explained with reference to FIG. 9, or across multiple wells in 2D or 3D views as explained with reference to FIG. 7. Multiple statistical parameters from the same well may also be plotted side by side as shown in FIG. 13 to allow the analyst to better characterize the overall drilling performance.

Figure 14:
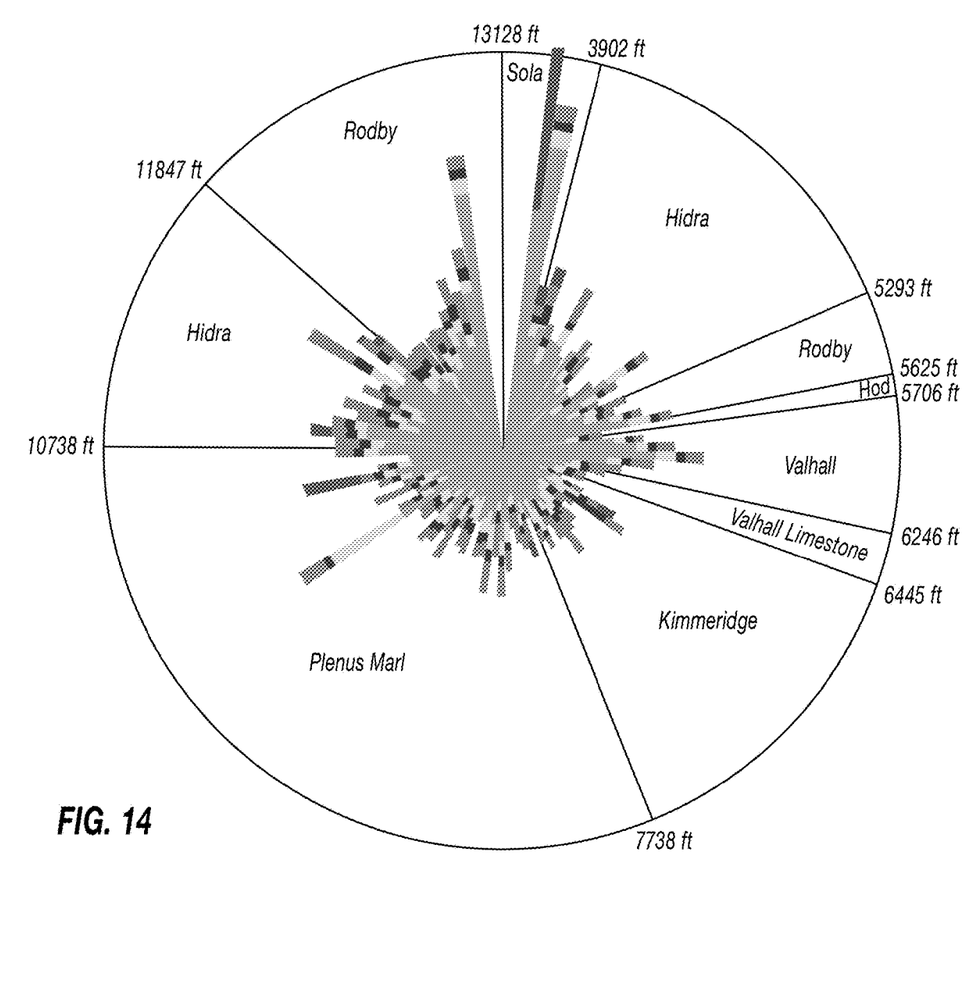
FIG. 14 shows an example of another type of two dimensional plot.

The rectangle representation explained above may be modified by plotting each stand as a segment of a circle. In the present example, the angle subtended by the arc of each circle segment may correspond to the depth drilled during each stand. The angular position of the circle segment around a circle corresponds to the depth of the well when the stand was drilled. The radial extent of the arc can be proportional to time, or block position, or to any other scaled parameter, as was the case with the rectangle representation described above. The arc (circle segment) can be colored or otherwise coded to represent various parameters as before, for example the plot in FIG. 14 shows the arcs related to the stands drilled during one hole section. The time breakdown may be color coded as before. The background segments show the lithology. Depth increases clockwise round the circle. In this example, time breakdown, drilling parameters, etc. may be coded onto each arc segment representing each stand.

A method for visual representation of drilling performance according to the various aspects of the present disclosure may enable more rapid identification of conditions which enhance or hinder drilling performance and may enable easier analysis of drilling performance as it relates to various drilling operating parameters and environmental parameters.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for generating a visual representation of wellbore drilling parameters during drilling operations to improve one or more of the drilling operations, comprising:
representing a predetermined length of drilled wellbore as a segmented two dimensional shape, wherein one dimension of the shape corresponds to the predetermined length of drilled wellbore and the other dimension of the shape comprises segments that correspond to a plurality of values of different drilling parameters;

in a computer, during at least one of the drilling operations, receiving input values of the different drilling parameters;

during the at least one drilling operation, using the input values, plotting the segmented two dimensional shape in a visual representation to a display, wherein plotting the segmented two-dimensional shape comprises aligning the two-dimensional shape with respect to a coordinate value of a coordinate axis based on a selected segment boundary; and during the at least one drilling operation, based on the visual representation, determining a response of the at least one drilling operation to improve one or more of the drilling operations.

2. The method of claim 1 wherein the two dimensional shape comprises a rectangle.

3. The method of claim 1 further comprising plotting two dimensional shapes for a plurality of sequentially drilled predetermined lengths of drilled wellbore wherein each two dimensional shape has a reference to a common parameter.

4. The method of claim 3 wherein the common parameter is disposed along a line in a two-dimensional plot or wherein the common parameter is disposed along a time-depth curve for drilling a wellbore.

5. The method of claim 3 wherein the common parameter is disposed along a geodetic trajectory plot of a wellbore.

6. The method of claim 3 further comprising plotting a wellbore lithology corresponding to an axial position along the wellbore of each two dimensional shape.

7. The method of claim 1 wherein the two dimensional shape comprises an arc segment of a circle, wherein an angle subtended by the arc segment represents the predetermined length and a radius of the arc segment represents the value.

8. The method of claim 1 further comprising plotting two dimensional shapes for a plurality of sequentially drilled predetermined lengths of drilled wellbore for a plurality of wellbores on a same plot.

9. The method of claim 1 further comprising coding selected portions of the two dimensional shape wherein the coding corresponds to each of a plurality of at least one of a drilling parameter, a statistical measure of a drilling or environmental parameter and an environmental parameter.

10. The method of claim 1 wherein the drilling parameter comprises a drilling operating parameter.

11. The method of claim 1 wherein the two-dimensional shape comprises at least one segment on either side of the coordinate value.

12. The method of claim 1 wherein the coordinate axis comprises a time-based coordinate axis.

13. The method of claim 1 wherein the coordinate axis comprises a time-based coordinate axis that characterizes times associated with operations for the predetermined length of drilled wellbore.

14. The method of claim 1 wherein the coordinate value corresponds to start of drilling for the predetermined length of drilled wellbore.

15. The method of claim 1 comprising plotting a plurality of segmented two-dimensional shapes wherein the plotting comprises aligning each of the two-dimensional shapes with respect to the coordinate value of the coordinate axis based on the selected segment boundary.

16. The method of claim 1 comprising using the response to improve at least one of the one or more drilling operations.

17. A system comprising:

a display; and a processor configured to generate a visual representation of wellbore drilling parameters during drilling operations to improve one or more of the drilling operations by:

representing a predetermined length of drilled wellbore as a segmented two dimensional shape, wherein one dimension of the shape corresponds to the predetermined length of drilled wellbore and the other dimension of the shape comprises segments that correspond to a plurality of values of different drilling parameters;

during at least one of the drilling operations, receiving input values of the different drilling parameters;

during the at least one drilling operation, using the input values, plotting the segmented two dimensional shape in a visual representation to the display, wherein plotting the segmented two-dimensional shape comprises aligning the two-dimensional shape with respect to a coordinate value of a coordinate axis based on a selected segment boundary; and during the at least one drilling operation, based on the visual representation, determining a response of the at least one drilling operation to improve one or more of the drilling operations.

18. The system of claim 17 comprising using the response to improve at least one of the one or more drilling operations.

19. A method for generating a visual representation of wellbore drilling parameters during drilling operations to improve one or more of the drilling operations, comprising:

representing a predetermined length of drilled wellbore as a segmented two dimensional shape, wherein one dimension of the shape corresponds to the predetermined length of drilled wellbore and the other dimension of the shape comprises segments that correspond to a plurality of values of different drilling parameters;

in a computer, during at least one of the drilling operations, receiving input values of the different drilling parameters;

during the at least one drilling operation, using the input values, plotting a plurality of the segmented two dimensional shapes for a plurality of sequentially drilled predetermined lengths of drilled wellbore in a visual representation to a display wherein each two dimensional shape has a reference to a common parameter wherein the common parameter is a starting time of connecting a stand of drill pipe to a drill string or is a starting time of lengthening the wellbore for a stand of drill pipe connected to a drill string; and during the at least one drilling operation, based on the visual representation, determining a response of the at least one drilling operation to improve one or more of the drilling operations.

20. The method of claim 19 comprising using the response to improve at least one of the one or more drilling operations.

* * * * *